United States Patent
Anidjar et al.

(10) Patent No.: US 7,923,868 B2
(45) Date of Patent: Apr. 12, 2011

(54) METHOD AND APPARATUS FOR ADJUSTING A POWER SUPPLY OF AN INTEGRATED CIRCUIT

(75) Inventors: Joseph Anidjar, Asbury, NJ (US); Mohammad S. Mobin, Orefield, PA (US); Gregory W. Sheets, Breinigsville, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 412 days.

(21) Appl. No.: 12/012,761

(22) Filed: Feb. 5, 2008

(65) Prior Publication Data

US 2008/0191789 A1 Aug. 14, 2008

Related U.S. Application Data

(60) Provisional application No. 60/899,683, filed on Feb. 6, 2007.

(51) Int. Cl.
*H02J 3/00* (2006.01)
(52) U.S. Cl. ........................................ 307/112
(58) Field of Classification Search .................. 307/112
See application file for complete search history.

(56) References Cited

U.S. PATENT DOCUMENTS

| 5,442,314 | A  | * | 8/1995  | Hara ............................ 327/543 |
|-----------|----|---|---------|------------------------------------------|
| 6,222,354 | B1 | * | 4/2001  | Song ............................ 323/273 |
| 6,870,410 | B1 | * | 3/2005  | Doyle et al. .................. 327/149   |
| 6,897,699 | B1 | * | 5/2005  | Nguyen et al. ................ 327/295    |
| 7,222,036 | B1 |   | 5/2007  | Thorne                                   |
| 7,332,973 | B2 | * | 2/2008  | Lee et al. ........................ 331/25 |
| 7,443,247 | B2 | * | 10/2008 | Camuffo ........................ 331/1 A   |
| 7,557,553 | B2 | * | 7/2009  | Su et al. ........................ 323/282 |
| 7,602,166 | B1 | * | 10/2009 | Kang ............................ 323/283  |
| 2003/0093160 | A1 | * | 5/2003 | Maksimovic et al. .......... 700/14     |
| 2006/0114037 | A1 |   | 6/2006 | Ajit                                    |
| 2006/0145739 | A1 |   | 7/2006 | Kim                                     |

* cited by examiner

*Primary Examiner* — Jared J Fureman
*Assistant Examiner* — Adi Amrany
(74) *Attorney, Agent, or Firm* — Ryan, Mason & Lewis, LLP

(57) ABSTRACT

Disclosed is a circuit configured to apply a supply voltage to a switching element (e.g., a transistor). The circuit includes a latch and a processor. The latch is configured to sample a voltage of an output signal of the switching element, and the processor is configured to generate a power adjustment signal to adjust the supply voltage based on the voltage sampled by the latch.

25 Claims, 15 Drawing Sheets

US 7,923,868 B2

METHOD AND APPARATUS FOR ADJUSTING A POWER SUPPLY OF AN INTEGRATED CIRCUIT

This application claims the benefit of U.S. Provisional Application No. 60/899,683 filed Feb. 6, 2007, which is incorporated herein by reference.

BACKGROUND OF THE INVENTION

The present invention relates generally to adjusting the supply voltage applied to an integrated circuit (IC).

Integrated circuits (ICs) typically include many switching elements, such as transistors. These switching elements are configured to perform a variety of circuit functions.

The operation of a transistor is typically affected by its process, voltage, and temperature ("PVT"). The "process" component of PVT refers to the process of manufacturing a transistor. The process is often classified as "fast", "slow", "nominal", or anywhere in between. Roughly speaking, a transistor manufactured using a fast process will transmit signals at a faster rate as compared to a transistor manufactured using a slower process. Likewise, a transistor manufactured using a slow process will, roughly speaking, transmit signals at a slower rate as compared to a transistor manufactured using a faster process. Once a transistor is manufactured using a particular process, the effect of the process is fixed. Thus, the "process" component of PVT cannot be adjusted to change the operating characteristics of a manufactured transistor.

The "temperature" component of PVT is the temperature at which the transistor operates. Similar to the process used to manufacture a transistor, the temperature at which a transistor operates affects how a transistor operates. In particular, the rate at which a transistor transmits a signal is affected by the temperature at which the transistor operates. For example, a transistor operating at a reference temperature requires a higher voltage to transmit signals at a higher rate. If the temperature of the transistor decreases, less voltage is needed to transmit signals at that rate. Similarly, if the temperature of the transistor increases, more voltage is needed to transmit signals at the higher rate. The "temperature" component of PVT varies during operation of the transistor. While there is some control over the temperature of an IC, such temperature cannot be sufficiently adjusted to result in a change in its operating characteristics.

The only component of PVT that can be varied effectively during operation to adjust a transistor's characteristics is its voltage. The optimum supply voltage of a transistor varies depending on the transistor's process (e.g., fast or slow) and the transistor's operating temperature. A conventional solution to the variation in the optimum supply voltage is to set the supply voltage to a worst-case value. In transistors manufactured with a fast process or operating at a low temperature, this conventional solution often results in too much power being supplied to a transistor, with the excess power being dissipated.

As an example, if a circuit designer determines (e.g., via simulation of an IC having many transistors) that a transistor manufactured with a slow process needs 3.2 V as a supply voltage, the circuit designer may provide a supply voltage of 3.2 V to each transistor on the IC. If another transistor on the IC was manufactured with a fast process, however, that transistor may only need a supply voltage of 3.0 V. When 3.2 V is supplied, excess power is dissipated on the transistor that only needs 3.0 V as a supply voltage. As the number of transistors on the IC that were manufactured with a fast process (or are operating at a low temperature) increases, the amount of dissipated power increases.

There have been several prior art techniques used to adjust the voltage supplied to transistors on an IC so as to reduce the amount of dissipated power. FIG. 1 shows one prior art technique—a prior art phase lock loop (PLL) oscillator 100. The PLL oscillator 100 adjusts the supply voltage by measuring a time delay between the input reference clock and output clock from a row of inverters 105. Thus, the PLL oscillator 100 uses the time domain to adjust the supply voltage.

In more detail, when a digital "1" is transmitted to the first inverter 110, the first inverter 110 outputs a digital "0", which is then transmitted to a second inverter 115. This process continues through the row of inverters 105 until a digital "1" is outputted from a sixth inverter 120. Thus, the output is the same as the input (i.e., a digital "1") but is delayed due to the propagation of the input through the row of inverters 105.

The input 123 to the row of inverters 105 is an analog signal (i.e., a sine wave). Input 123 and output 125 of the row of inverters 105 are both transmitted to a phase detector 130. The phase detector 130 determines whether the voltage phase of an input sine wave at input 123 is phase aligned with the voltage phase of an output sine wave at output 125. In particular, the phase detector 130 detects whether the phase of the output signal at output 125 leads or lags the phase of the input signal at input 123. If the sine waves are not phase aligned, charge pump 133 charges or discharges for phase difference and adjusts voltage source 135, which in turn changes the supply voltage applied to each inverter in the row of inverters 105. As the voltage applied to the row of inverters changes, the delay that each inverter introduces to the input signal at input 123 will change. As a result, the phase of the output signal (sine wave) at output 125 is adjusted. The changing of the voltage supplied to each inverter in the row of inverters 105 stops when the phase of the input signal at input 123 and the phase of the output signal at output 125 are aligned.

FIG. 2 is a block diagram of another prior art circuit 200 that uses the time domain to adjust the voltage supplied to transistors on an IC so as to reduce the amount of dissipated power. An input signal 205a is transmitted to input 205 of a buffer 210. The buffer 210 delays the signal to produce an output signal 215a on output line 215. The output signal 215a is transmitted to an exclusive OR (XOR) gate 220. The XOR gate 220 produces an XOR signal 225a on signal line 225. XOR signal 225a represents the time delay between the output signal 215a and the input signal 205a.

The signal 225a is then input to a filter 230 for filtering and then to an analog-to-digital converter (ADC) 235 to convert the analog signal to a digital signal. The digital signal is then transmitted to a comparator 240 which compares the digital bits to a target PVT code 245. The target PVT code 245 is a code that represents a target signal for the voltage supplied to the buffer 210. The comparator 240 is used to control the voltage of the buffer 210 (via a feedback loop 250) (e.g., by increasing or decreasing the buffer voltage) based on its comparison with the target PVT code 245.

There are several problems associated with these prior art solutions. As described above, when setting the supply voltage to a worst case value, significant power is dissipated. Also, when using the time domain to determine the time delay and to adjust the supply voltage based on this time delay, the measured delay may be inaccurate due to jitter (i.e., the unwanted variation of one or more signal characteristics). Further, circuitry specific to determining the time delay is often needed in the IC to adjust the supply voltage.

Therefore, there is a need for an improved technique for adjusting the supply voltage applied to switching elements in a circuit.

BRIEF SUMMARY OF THE INVENTION

In accordance with an embodiment of the present invention, a circuit configured to adjust a supply voltage applied to a switching element (e.g., a transistor) includes a latch and a processor. The latch is configured to sample a voltage of an output signal of the switching element. The processor is configured to generate a power adjustment signal indicating an adjustment to the supply voltage applied to the switching element. The adjustment is based on the voltage sampled by the latch.

In one embodiment, the latch is configured to sample the voltage of the output signal of the switching element periodically. Further, the latch may be configured to sample the voltage of an output signal at a rising edge of the output signal or at a falling edge of the output signal. In one embodiment, the circuit includes a plurality of latches.

The circuit may include one or more additional elements. In one embodiment, the circuit includes at least one counter that is configured to count a plurality of voltages sampled by the latch and transmit an output signal to the processor. The output signal is based on the plurality of voltages sampled by the latch. The processor may then determine whether the output signal indicates a digital "1", a digital "0", or a transition point. The processor may adjust the supply voltage when the output signal indicates a digital "1" or a digital "0". In one embodiment, the digital "1" or digital "0" are histogram values.

In another embodiment, the circuit also includes a threshold voltage generator that adjusts a threshold voltage applied to the latch. The circuit may also include a regulator control module that transmits the adjusted supply voltage to a plurality of switching elements. The circuit may also include a plurality of power supplies, with each power supply receiving the power adjustment signal and providing a supply voltage to a switching element in a plurality of switching elements.

These and other advantages of the invention will be apparent to those of ordinary skill in the art by reference to the following detailed description and the accompanying drawings.

DETAILED DESCRIPTION

Figure 1:
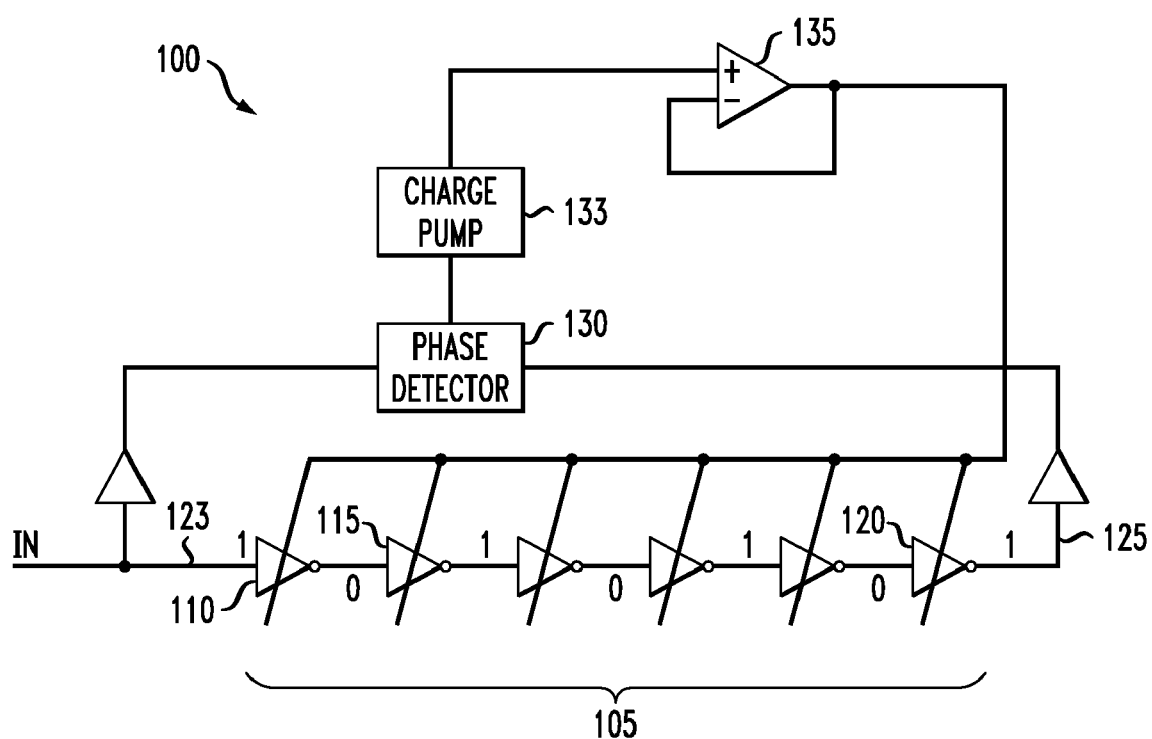
FIG. 1 shows a prior art phase lock loop (PLL) oscillator used to adjust voltage so as to reduce the amount of dissipated power.
Figure 2:
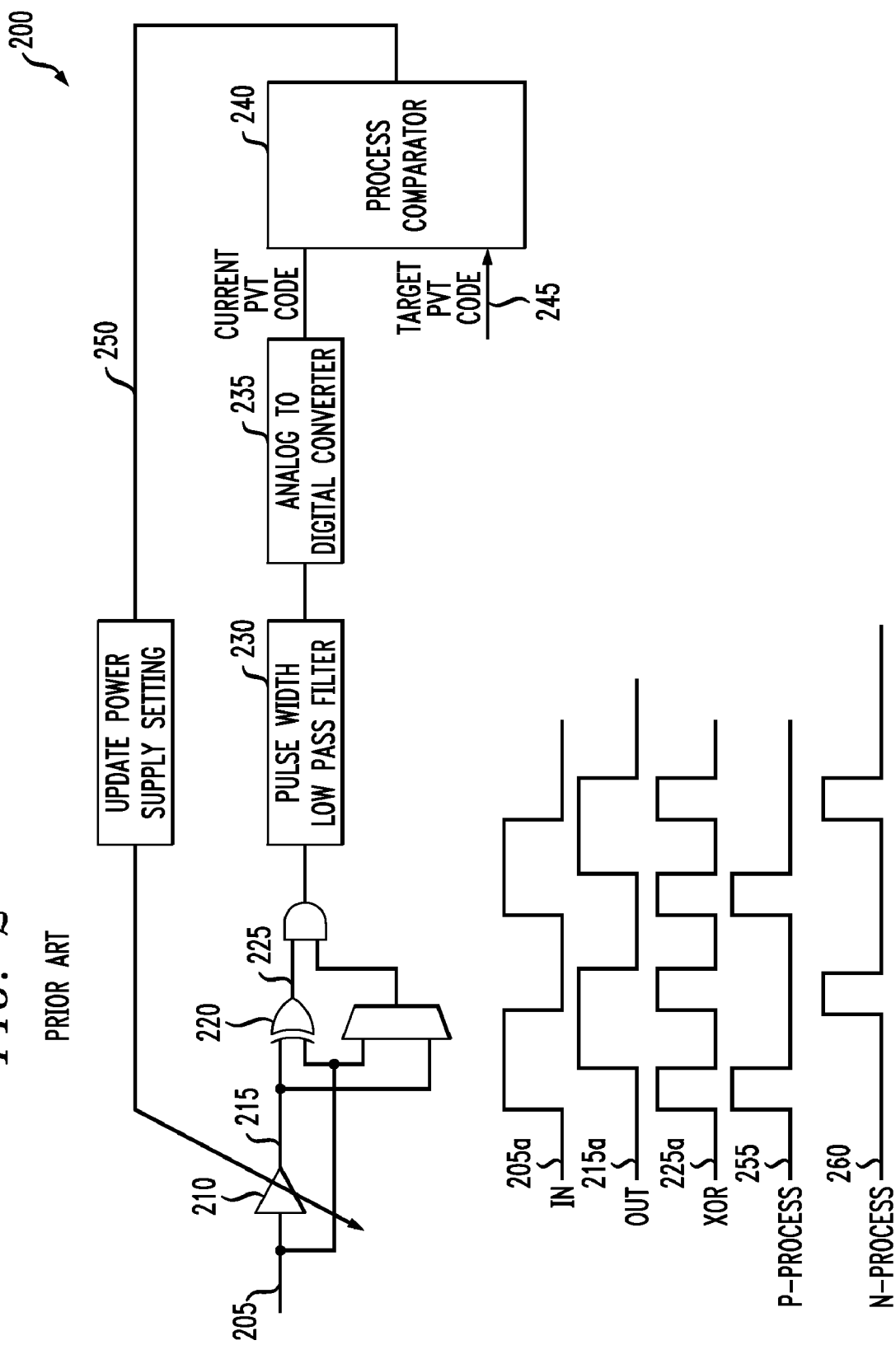
FIG. 2 is a block diagram of another prior art circuit used to adjust voltage so as to reduce the amount of dissipated power.
Figure 3A:
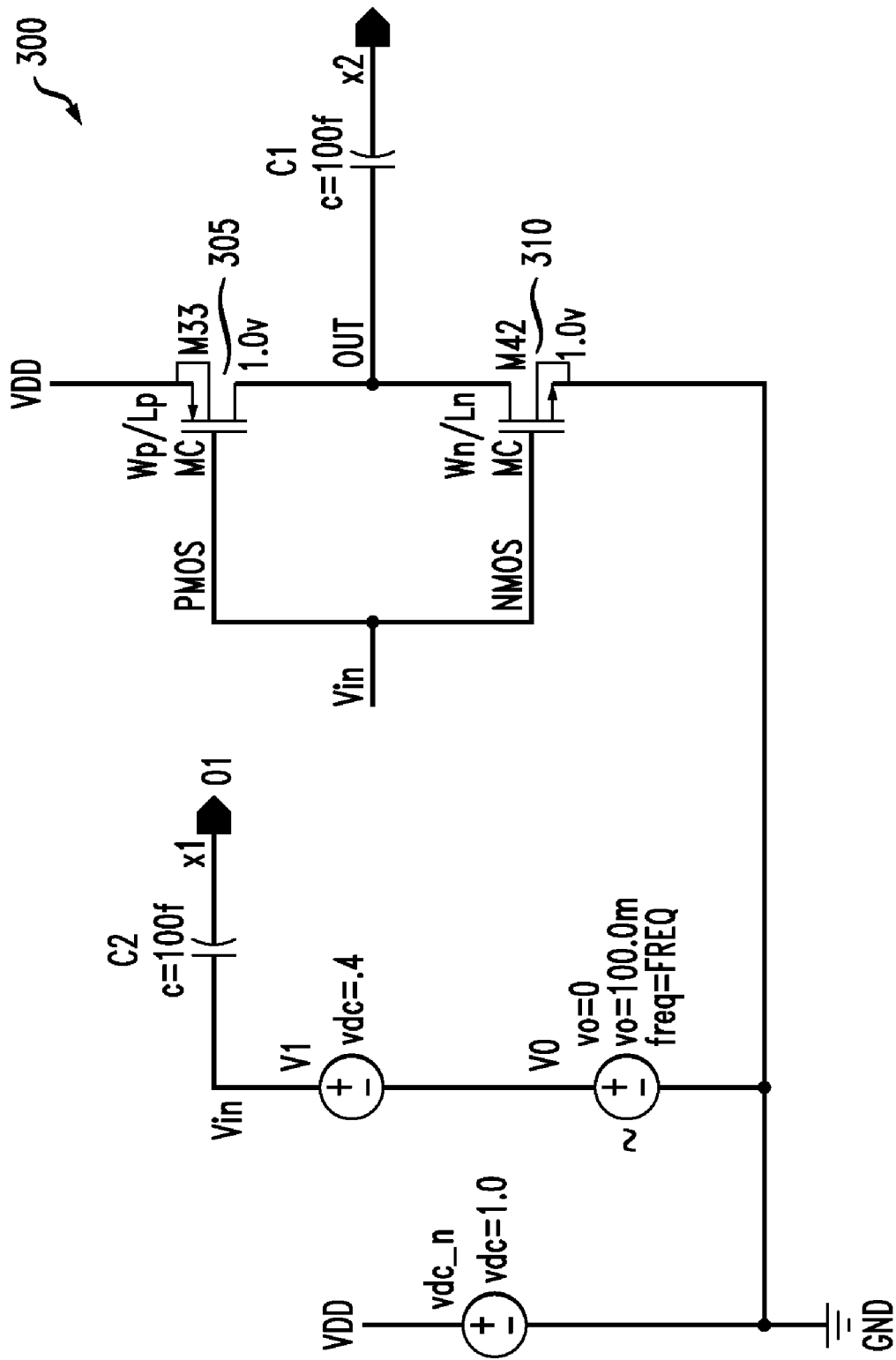
FIG. 3A shows a circuit diagram of a simulation circuit to illustrate the effects of process variation for an inverter in accordance with an embodiment of the present invention.
Figure 3B:
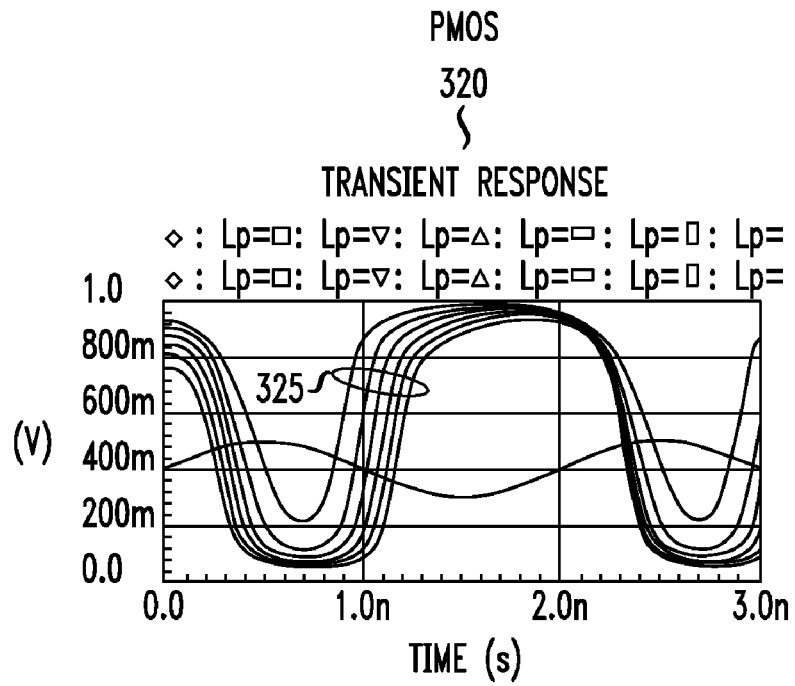
FIG. 3B shows a plot illustrating that a rising edge spread is responsible for PMOS variation with respect to the simulation circuit of FIG. 3A.
Figure 3C:
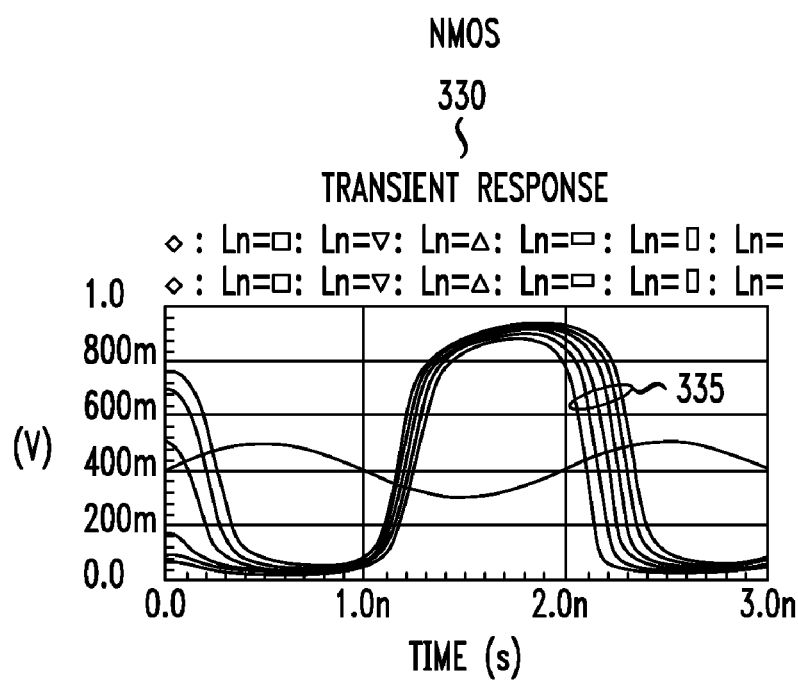
FIG. 3C shows a plot illustrating that a falling edge spread is responsible for NMOS variation with respect to the simulation circuit of FIG. 3A.

FIG. 3A shows a circuit diagram of a simulation circuit to illustrate the effects of process variation for an inverter 300. The inverter 300 includes a PMOS transistor 305 and an NMOS transistor 310. Each transistor 305, 310 is driven by a clock signal ($v_{in}$). A simulation is performed on the inverter 300 by varying the channel length of the PMOS transistor 305 and the channel length of the NMOS transistor 310. The results of the simulation are shown in FIGS. 3B and 3C. FIG. 3B shows a plot 320 illustrating that a rising edge spread 325 causes PMOS variation. A rising edge of a signal in a plot is the part of the signal that has a positive slope. For example, the rising edge of a signal in a plot occurs sooner for a transistor manufactured using a fast process compared with the rising edge of a signal in a plot for a transistor manufactured using a slower process.

FIG. 3C shows a plot 330 illustrating that a falling edge spread 335 causes NMOS variation. A falling edge of a signal in a plot is the part of the signal that has a negative slope. For example, the falling edge of a signal in a plot occurs sooner for a transistor manufactured using a fast process compared with the falling edge of a signal in a plot for a transistor manufactured using a slower process. As a result, determining the effects of a PMOS transistor in an IC can be achieved by detecting the rising edge shift from a target position. Determining the effects of an NMOS transistor in an IC can be achieved by detecting the falling edge shift from the target position. To detect the rising and falling edges of a signal, a latch is used to sample a signal being output from the inverter 300 of FIG. 3A. Specifically, a latch with an adjustable threshold is used to sample the output signal of the inverter 300.

Figure 4:
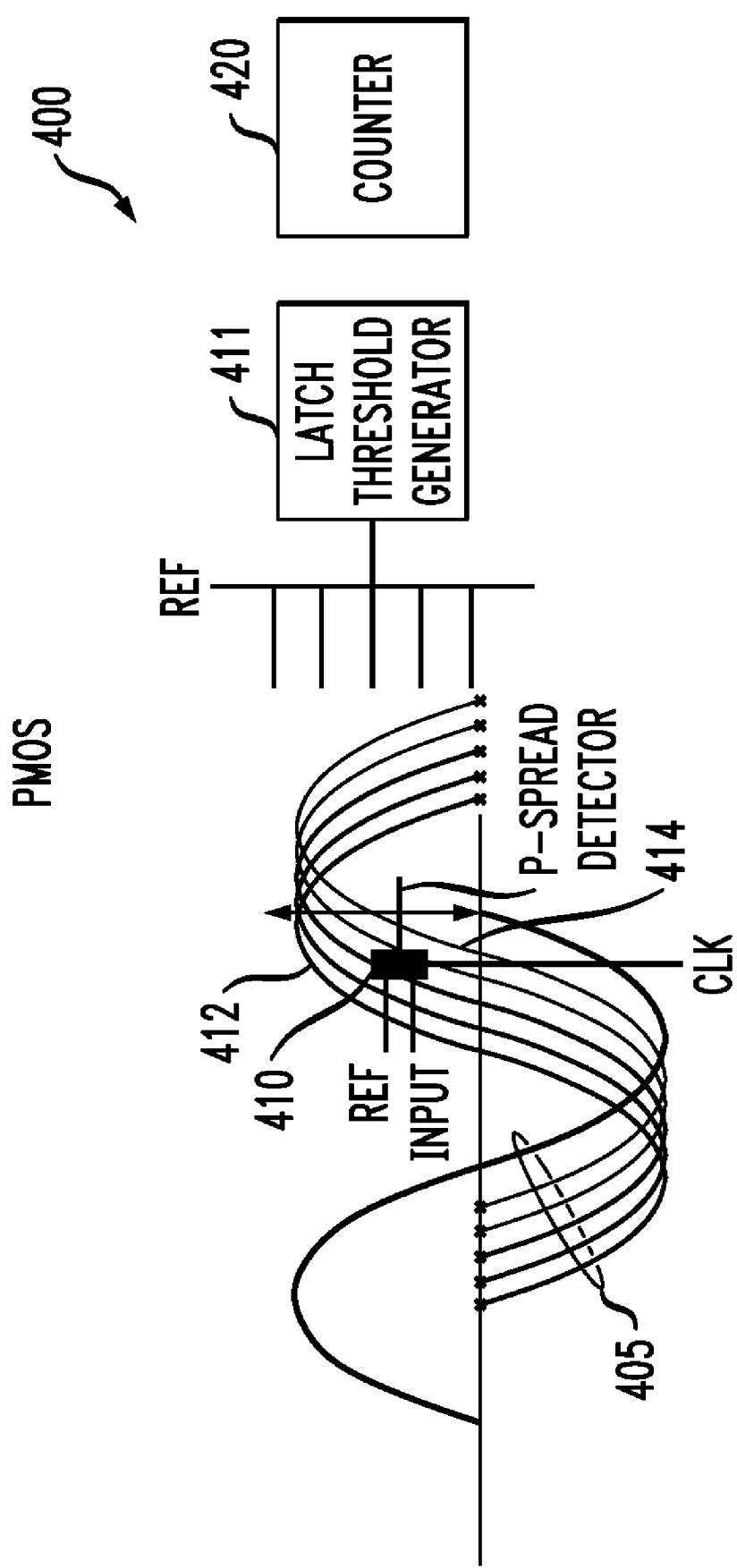
FIG. 4 shows a plot of an output signal of the PMOS transistor of the inverter of FIG. 3A.

FIG. 4 shows a plot 400 of signals 405 that may be the output of the PMOS transistor of the inverter 300 of FIG. 3A. A latch 410 is configured to operate at a voltage threshold in order to sample an output signal of the PMOS transistor (e.g., one of the signals 405) at the rising edge of the output signal. A latch threshold generator 411 generates and adjusts the latch threshold voltage. This threshold voltage is denoted by REF in plot 400.

For a fast process, the voltage of the output signal (e.g., the voltage of output signal 412) will be higher than the threshold voltage that the latch 410 is sampling at when the latch 410 samples the output signal (e.g., output signal 412). As a result, the latch 410 will see a digital "1" by the time the latch 410 samples the output signal. On the other hand, for a slow process, the voltage of an output signal (e.g., the voltage of output signal 414) will be lower than the voltage that the latch 410 is sampling at when the latch 410 samples the output signal (e.g., output signal 414). As a result, the latch 410 will see a digital "0" by the time the latch 410 samples the output signal (e.g., output signal 414). A counter 420 counts the output of the latch 410 for a predetermined time period. For example, the latch 410 may sample ten digital 1's in a row. This sequence may represent a digital "1". Similarly, the latch 410 may sample ten digital 0's in a row. This sequence may represent a digital "0".

The supply voltage of the inverter is then changed until a transition in the output signal is detected. A transition in the output signal occurs when the latch 410 measures an approximately equal number of digital "0"s and digital "1" s for a predetermined number of samples of the output signal. For example, in the ideal case, if the latch 410 samples five 0's and five 1's in ten samples of a given output signal, then the output signal is in a transition state and this indicates that the voltage is set at its optimum level.

Figure 5:
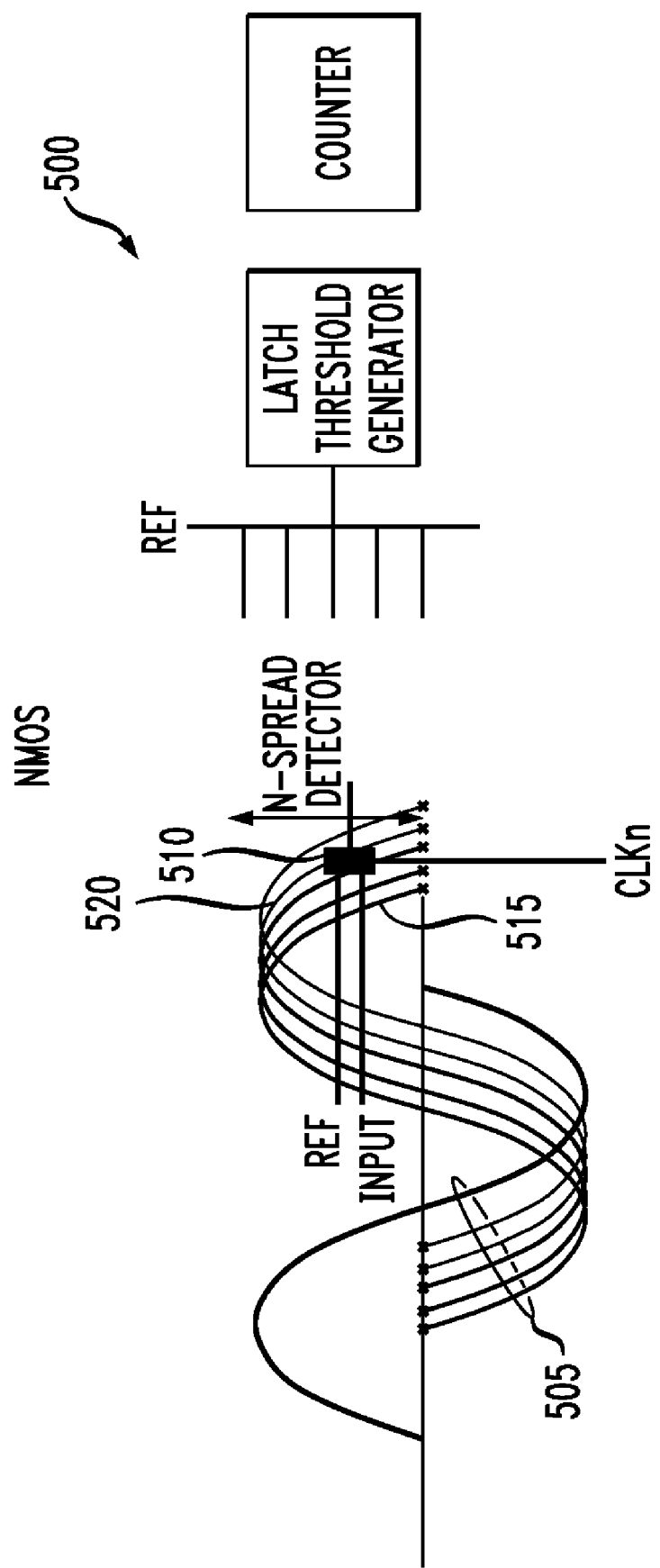
FIG. 5 shows a plot of an output signal of the NMOS transistor of the inverter of FIG. 3A.

FIG. 5 shows a plot 500 of signals 505 that may be the output of the NMOS transistor of the inverter 300 of FIG. 3. A latch 510 is configured to operate at a voltage threshold in order to sample an output signal of the NMOS transistor (e.g., one of the signals 505) at the falling edge of the output signal.

For a fast process, the voltage of the output signal (e.g., the voltage of output signal 515) will be lower than the threshold voltage that the latch 510 samples at when the latch 510 samples the output signal (e.g., output signal 515). As a result, the latch 510 will see a digital "0" by the time the latch 510 samples the output signal. On the other hand, for a slow process, the voltage of an output signal (e.g., the voltage of output signal 520) will be higher than the voltage that the latch 510 is sampling at when the latch 510 samples the output signal (e.g., output signal 520). As a result, the latch 510 will see a digital "1" by the time the latch 510 samples the output signal 520.

The supply voltage of the inverter is then changed until a transition in the output signal is detected. A transition in the output signal occurs when the latch 410 measures an approximately equal number of digital "0"s and digital "1"s for a predetermined number of samples of the output signal. For example, in the ideal case, if the latch 410 samples five 0's and five 1's in ten samples of a given output signal, then the output signal is in a transition state and this indicates that the voltage is set at its optimum level.

Figure 6:
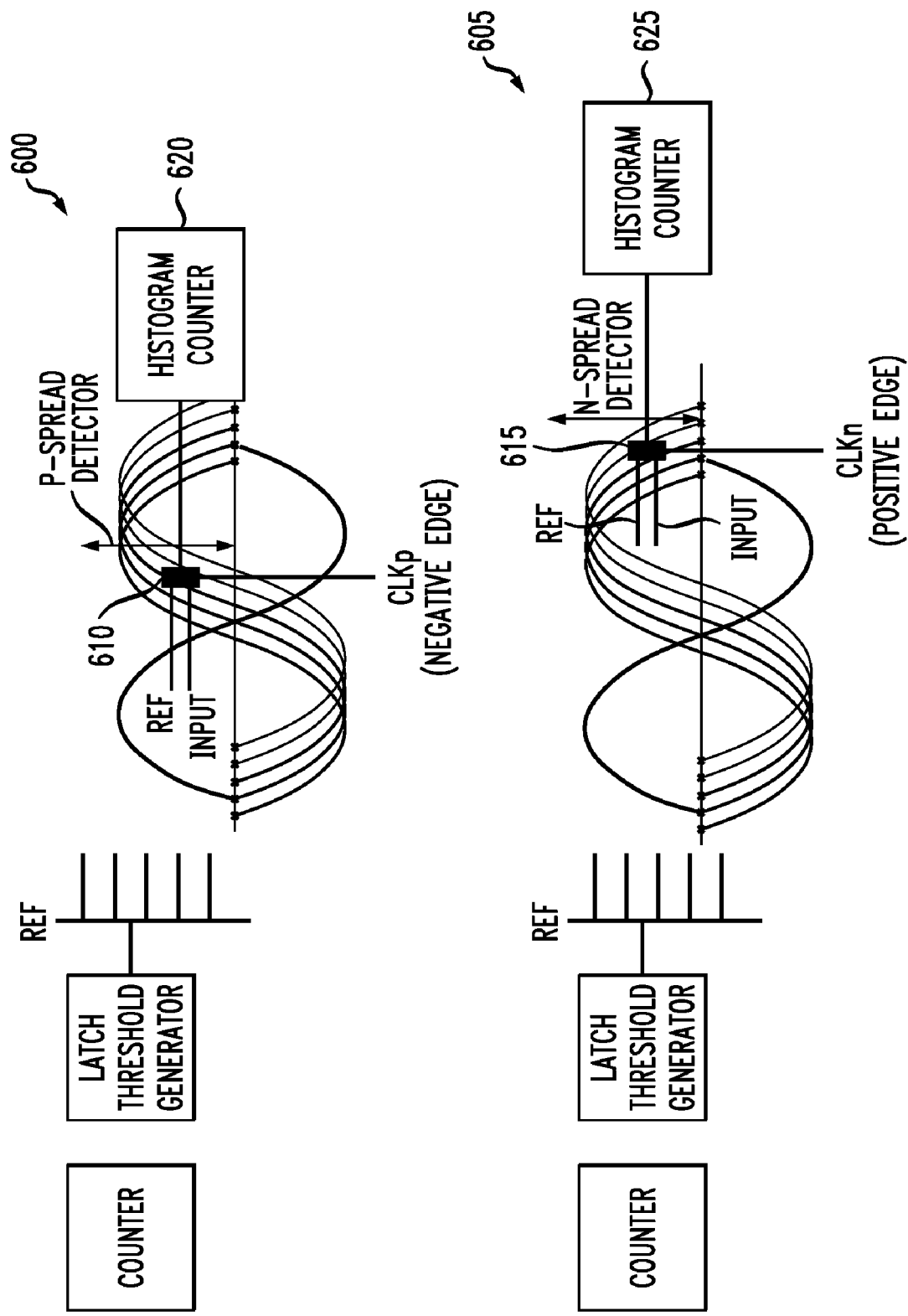
FIG. 6 shows a plot of the output signals shown in FIG. 4 and FIG. 5.

FIG. 6 shows a plot 600 with a clock having a positive edge and a plot 605 with a clock having a negative edge. Each plot 600, 605 shows a respective latch 610, 615 and a respective histogram counter 620, 625. In one embodiment, each histogram counter 620, 625 is used to guard against clock jitter variation. FIG. 6 is a combination of the plots of the output signals of the inverter shown in FIG. 4 and FIG. 5.

Figure 7A:
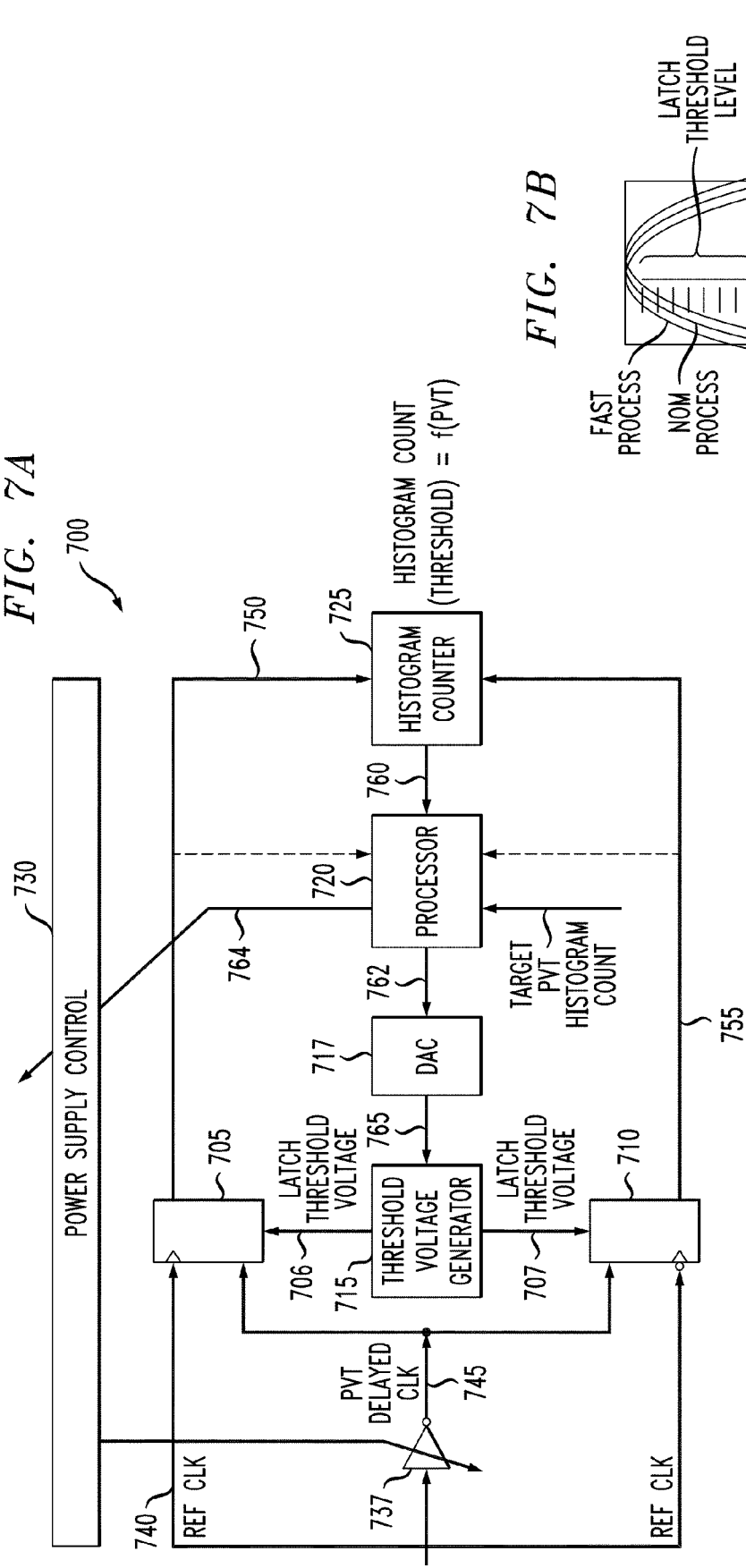
FIG. 7A is a block diagram of a PVT detector in accordance with an embodiment of the present invention.

FIG. 7A is a block diagram of a PVT detector 700 in accordance with an embodiment of the present invention. The PVT detector 700 includes two latches 705, 710, a threshold voltage generator 715, a digital-to-analog converter (DAC) 717, a processor 720 (e.g., a microprocessor or a state machine), a histogram counter 725, and a power supply control 730. The PVT detector 700 may also have a plurality of latches, threshold voltage generators, DACs, processors, histogram counters, and/or power supply controls.

Latch 705 is a latch that measures the rising edge spread of a voltage signal (the PMOS signal) and latch 710 is a latch that measures the falling edge spread of a voltage signal (the NMOS signal). Each latch 705, 710 receives a reference clock signal REF CLK as well as a PVT delayed clock signal 745. The PVT delayed clock signal 745 is a function of the supply voltage being applied to the switching element 737 and is the signal that each latch 705, 710 is sampling.

The threshold voltage generator 715 generates a threshold voltage at which the latch 705, 710 samples the PVT delayed clock signal 745. The processor 720 adjusts the power supply control 730 to generate different PVT delayed clock signals 745 based on the respective outputs 750, 755 of the latches. Specifically, the outputs 750, 755 of the latches 705, 710 are transmitted to the histogram counter 725 which obtains a number of samples. The histogram counter 725 generates a histogram counter output 760 which is input to the processor 720. The processor 720 uses the histogram counter output 760 to adjust the power supply control 730. In one embodiment, the power supply is external to the circuit 700. Alternatively, the power supply may be part of the circuit 700. The processor's 720 functions are defined by software (embedded or otherwise), firmware, hardware, or various combinations of software, firmware, and hardware.

The processor 720 may also adjust the threshold voltage by transmitting a signal 762 to DAC 717. DAC 717 converts the signal 762 to an analog signal and transmits the analog signal to the threshold voltage generator 715 to generate a threshold voltage for the latches 705, 710.

Figure 8:
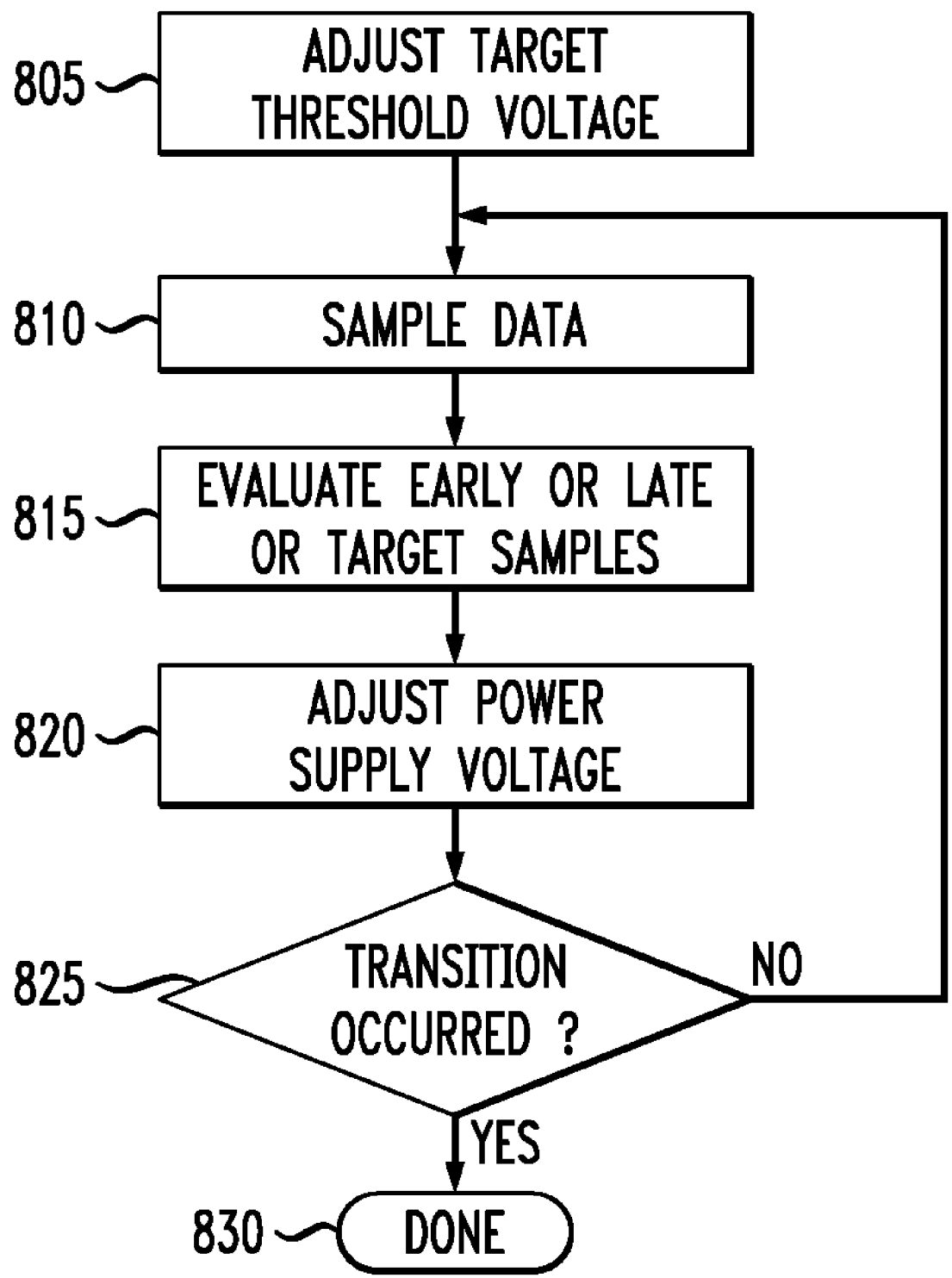
FIG. 8 is a flowchart illustrating the steps performed by the PVT detector of FIG. 7A.

FIG. 8 is a flowchart illustrating the steps performed by the PVT detector 700 of FIG. 7A. In step 805, the processor 720 adjusts the target threshold voltage by transmitting a digital signal 762 to DAC 717. DAC 717 converts the signal 762 to an analog signal 765 and transmits this signal 765 to the threshold voltage generator 715 to generate a threshold voltage 706 and 707 for the latches 705, 710.

The latches 705, 710 then sample data in step 810. The latches 705, 710 transmit the samples 750, 755 to the histogram counter 725 which counts the samples. The histogram counter 725 transmits the output 760 to the processor 720 and the processor 720 evaluates the samples in step 815. For example, the processor 720 may determine that the output 760 indicates a "1" as described above if a predetermined number of 1's are in the histogram counter output 760. The processor 720 may also determine that the output 760 indicates a zero if a predetermined number of 0's are in the output 760.

The processor 720 then adjusts the supply voltage delivered by the power supply control 730 (or a power supply in communication with the power supply control 730) in step 820. In particular, the processor 720 generates a power adjustment signal based on the histogram counter output 760. The power adjustment signal indicates an adjustment to a supply voltage to be applied to the transistors. The processor 720 transmits power adjustment signal 764 to the power supply control 730. The power supply control 730 adjusts (or communicates with a power supply to adjust) the PVT delayed clock signal 745 with a new supply voltage corresponding to the power adjustment signal 764. This correspondence may be a direct correspondence (e.g., one to one correspondence) or an indirect correspondence (e.g., based on some formula). This PVT delayed clock signal 745 is transmitted to the latches 705, 710.

The processor 720 then determines if a transition has occurred during the supply voltage adjustment process in step 825 if the output 760 indicates an equal number of (or relatively close number of) 0's and 1's. In another embodiment, the histogram counter 725 makes these determinations rather than the processor 720. If a transition has not occurred, the process returns to step 810 and the latches 705, 710 sample the new PVT delayed clock signal 745. If a transition has occurred in step 825, then the supply voltage is set to its optimal value and no further adjustment is necessary (step 830).

The configuration of a PVT detector as described above (e.g., in FIG. 7A and FIG. 8) can vary. As described above, a PMOS transistor and an NMOS transistor may be manufactured via similar or different processes. For example, a PMOS transistor may be manufactured via a slow process while an NMOS transistor may be manufactured via a slow process, a fast process, or a nominal process. Similarly, a PMOS transistor may be manufactured via a nominal process while an NMOS transistor may be manufactured via a slow process, a fast process, or a nominal process. A PMOS transistor may also be manufactured via a fast process while an NMOS transistor may be manufactured via a slow process, a fast process, or a nominal process.

Figure 7B:
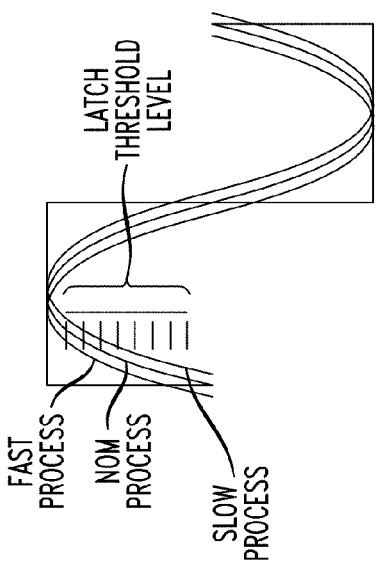
FIG. 7B shows a plot of an output signal of the inverter of FIG. 7A.

FIG. 7B shows exemplary plots of PVT delayed clock signal 745 for various manufacturing processes including a fast process, a nominal process and a slow process. Additionally, FIG. 7B shows exemplary levels of latch threshold voltage 706 at which latch 705 may sample PVT delayed clock signal 745.

Many configurations of a PVT detector are possible. For example, PVT detection may occur in a centralized manner or in a distributed manner. Similarly, PVT correction may also occur in a centralized manner or in a distributed manner.

Figure 9:
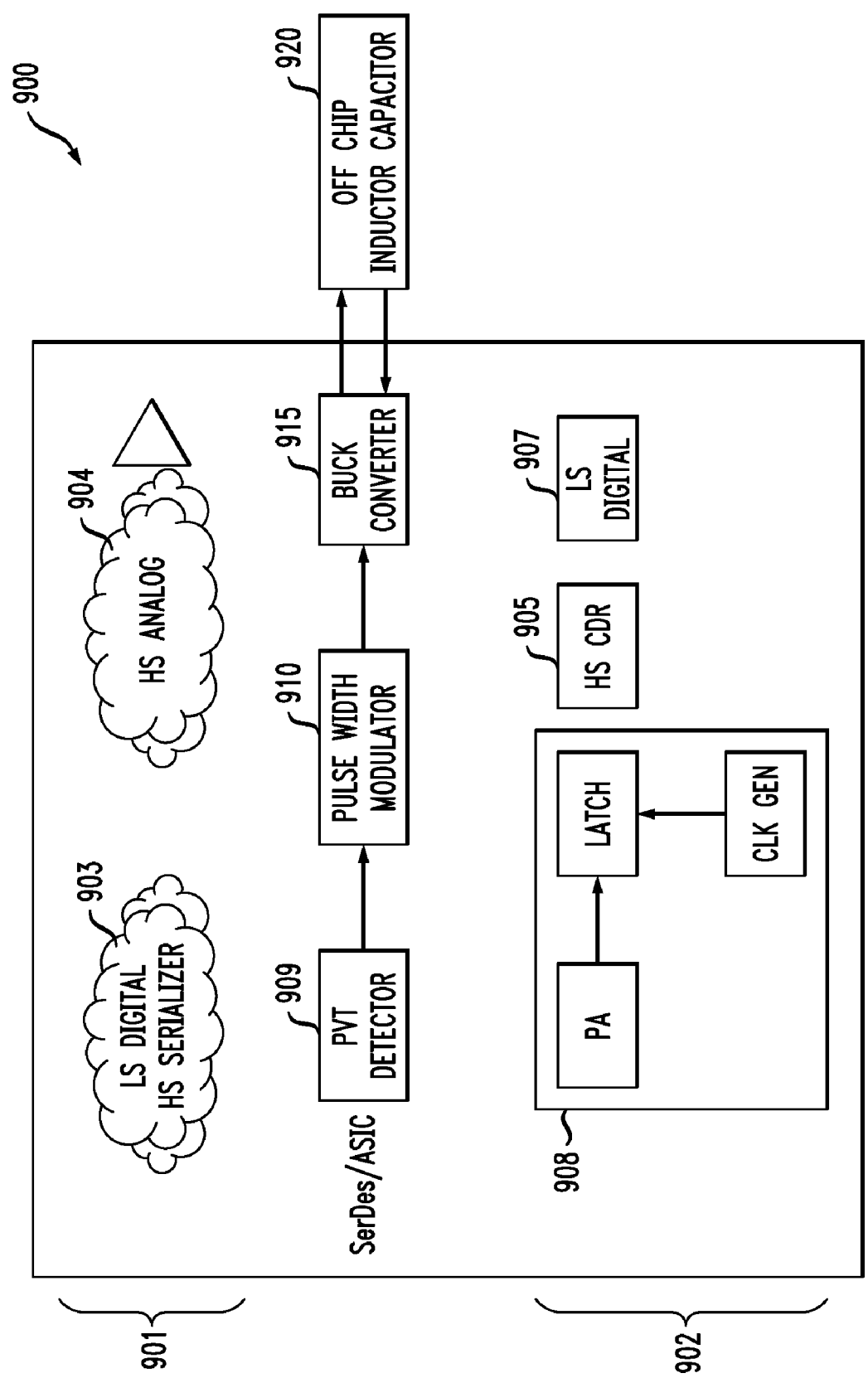
FIG. 9 is a block diagram of a chip having central PVT detection and central PVT correction.

FIG. 9 is a block diagram of a chip 900 (e.g., a serializer/deserializer (SerDes) or an Application Specific Integrated Circuit (ASIC)) having central PVT detection and central PVT correction. (The chip 900 is divided into transmitter circuits 901 and receiver circuits 902.)

The transmitter circuits 901 include one or more circuits such as a low speed digital and high speed serializer circuit 903 and a high speed analog circuit 904. The receiver circuits 902 include a high speed clock and data recovery (CDR) circuit 905, a low speed digital circuit 907, and a preliminary amplifier circuit 908. Chip 900 includes a centralized PVT detector 909 in communication with a pulse width modulator 910. The centralized PVT detector 909 detects and adjusts the effects of PVT for transistors on the entire chip 900. The pulse width modulator 910 modulates the output of the PVT detector 909 and transmits this modulated signal to a buck converter 915. The buck converter 915 is a power supply in communication with an off chip inductor and/or capacitor 920.

The central PVT detector 909 may save costs associated with the chip 900 because only one PVT detector 909 is used on the chip 900. Further, if the chip 900 includes transistors manufactured in a uniform manner, only one PVT detector 909 is needed to adjust the supply voltage supplied to the transistors on the chip 900.

Figure 10:
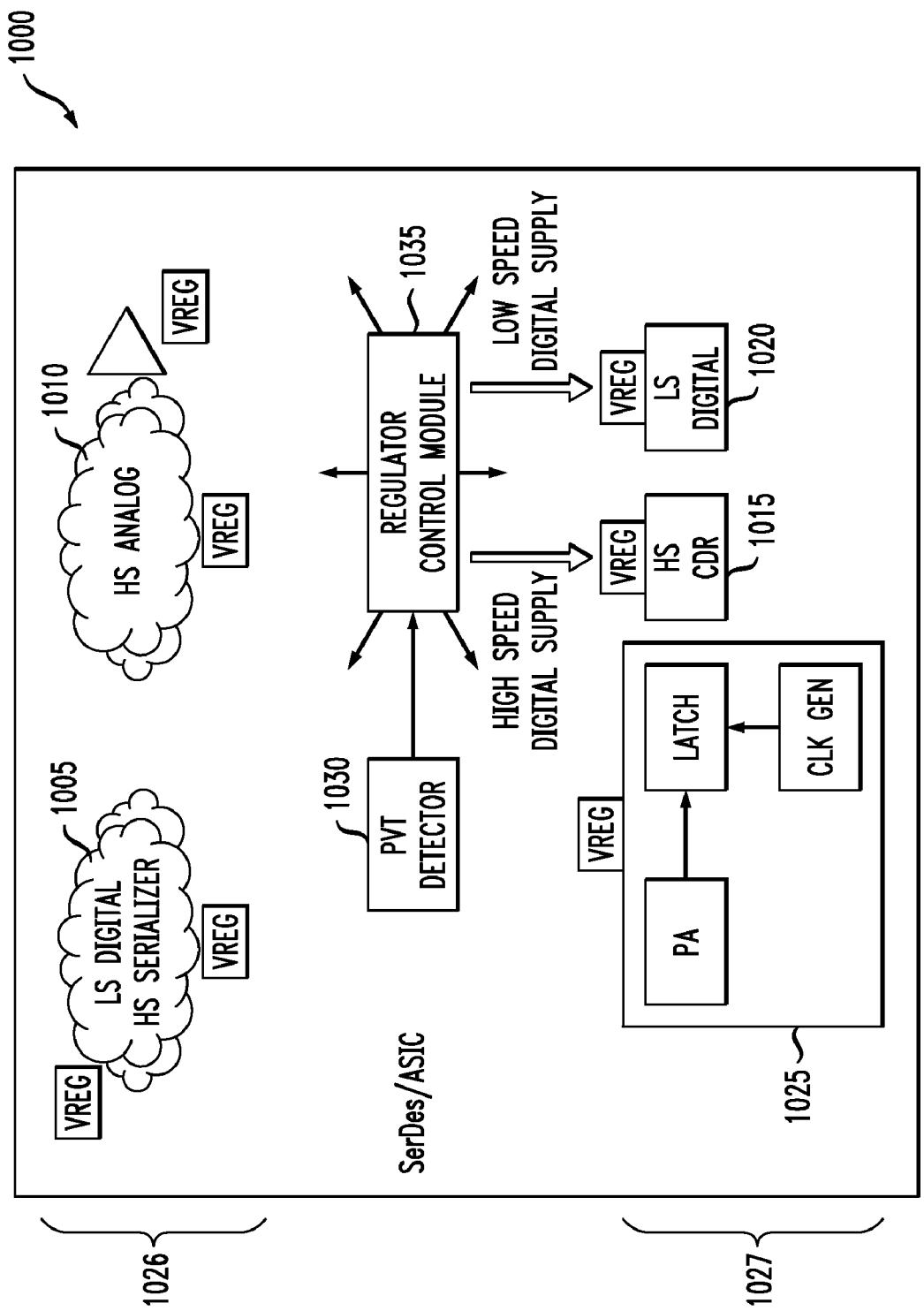
FIG. 10 is a block diagram of a chip having central PVT detection and distributed PVT correction.

FIG. 10 is a block diagram of a chip 1000 having central PVT detection and distributed PVT correction. Chip 1000 has similar circuits as described above, such as a low speed digital and high speed serializer circuit 1005, a high speed analog circuit 1010, a high speed CDR 1015, a low speed digital circuit 1020, and a preliminary amplifier circuit 1025. These circuits are divided into transmitter circuits 1026 and receiver circuits 1027. Each circuit 1005-1025 has an independent voltage regulator (VREG).

The chip 1000 has a single PVT detector 1030 in communication with a regulator control module 1035. The regulator control module 1035 communicates the output of the PVT detector 1030 to the chip's various circuits 1005-1025. In one embodiment, the regulator control module 1035 adjusts the VREG of each circuit 1005-1025 in response to the output of the PVT detector 1030. Thus, chip 1000 has a centralized PVT detector 1030 but distributed PVT correction due to the regulator control module 1035.

Figure 11:
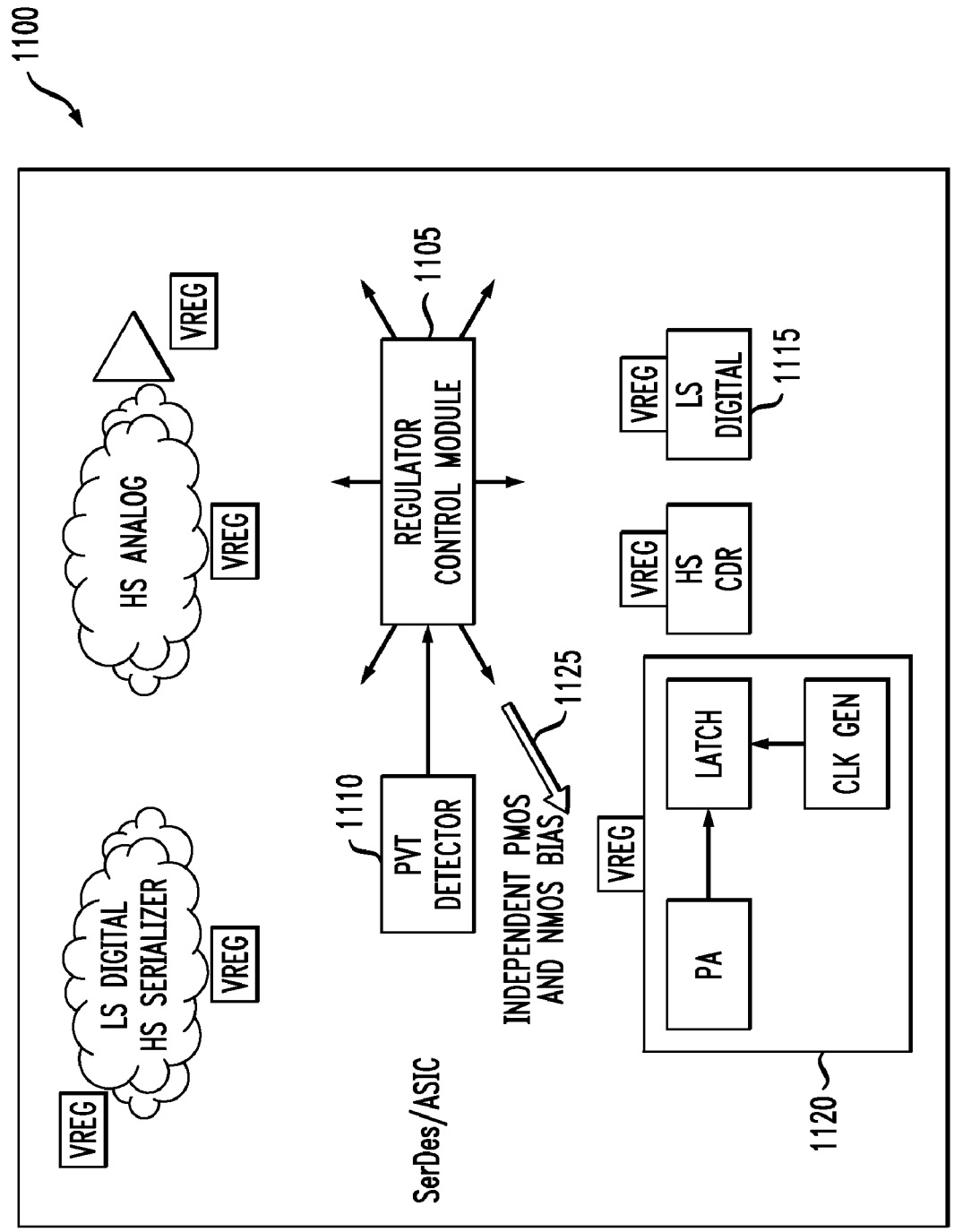
FIG. 11 is a block diagram of a chip having central PVT detection and distributed PVT correction.

FIG. 11 shows another embodiment of a chip 1100 having centralized PVT detection and distributed PVT correction. Chip 1100 has a regulator control module 1105 connected to a PVT detector 1110. The regulator control module 1105 transmits a voltage adjustment to the various other circuits on the chip 1100, such as a low speed digital circuit 1115 as described above. In chip 1100, however, the regulator control module 1105 provides an independent PMOS and NMOS bias to preliminary amplifier circuit 1120. The independent PMOS and NMOS bias is shown with arrow 1125. Thus, chip 1100 has centralized PVT detection but a distributed PVT correction and provides an independent PMOS and NMOS bias to one (or more) of the chip's circuits (e.g., the preliminary amplifier circuit 1120).

Figure 12:
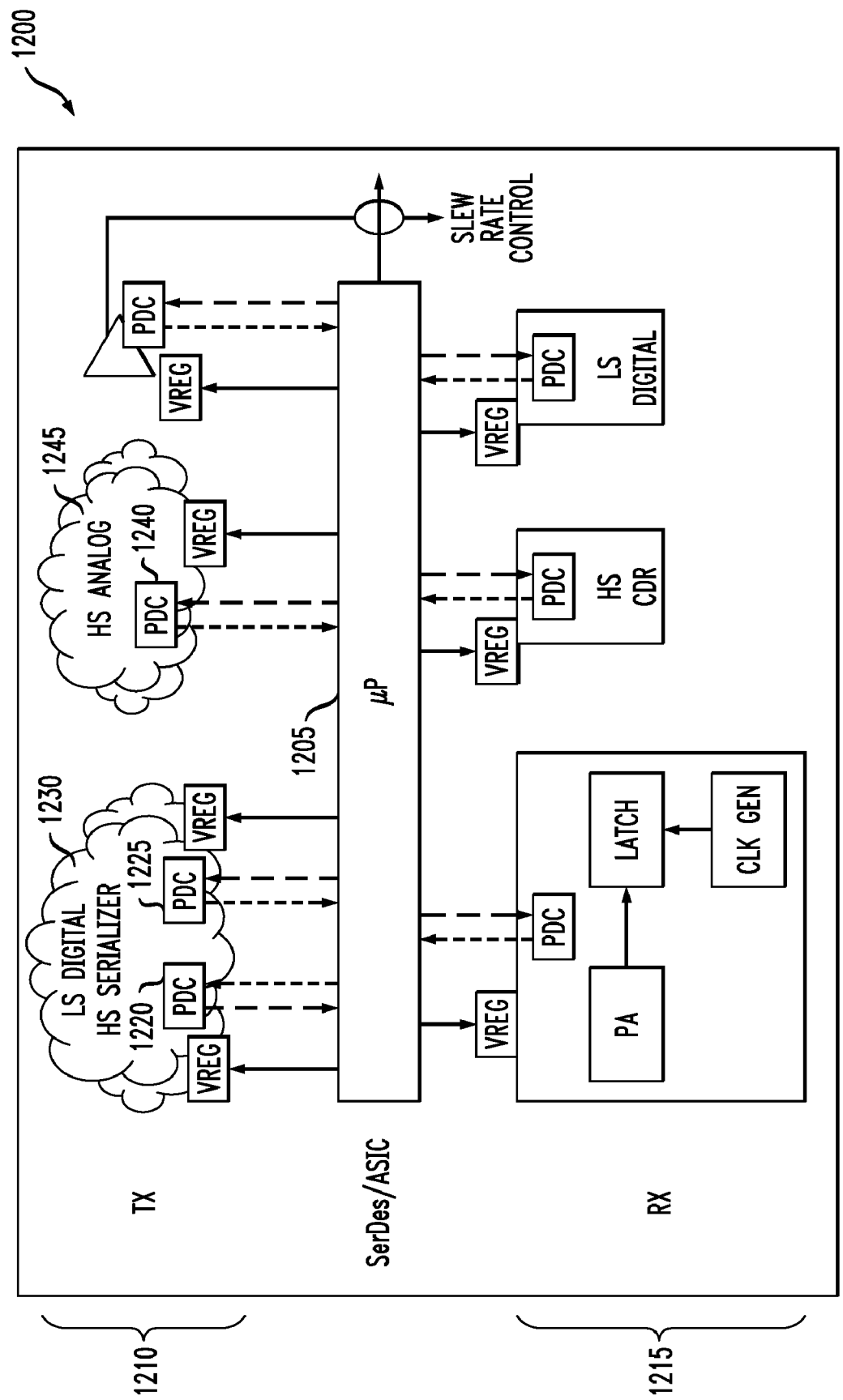
FIG. 12 is a block diagram of a chip having a centralized processor in communication with distributed PVT detectors and distributed voltage controllers.

FIG. 12 shows an embodiment of a chip 1200 having a centralized processor 1205 in communication with distributed PVT detectors and distributed voltage controllers. In particular, chip 1200 is divided into transmitter circuits 1210 and receiver circuits 1215. The latch as described above is now placed in the various circuits of chip 1200. As a result, the low speed circuits will receive a supply voltage of one value while the high speed circuits will receive a supply voltage of another value. This distributes the PVT detection and adjustment to more accurately configure the chip 1200 to reduce dissipated power.

Specifically, the processor 1205 communicates with distributed PVT detector circuits (PDC), such as PDC 1220 and PDC 1225 of the low speed digital and high speed serializer circuit 1230 and PDC 1240 of the high speed analog circuit 1245, to adjust the supply voltage supplied to the different circuit transistors.

The processor 1205 includes a central histogram counter (as described above). Thus, with respect to the PVT detector (such as the PVT detector shown in FIG. 7A), the latches are positioned in the various chip circuits while the histogram counter and processor (of FIG. 7A) are central to the chip 1200 and communicate with the latches.

Figure 13:
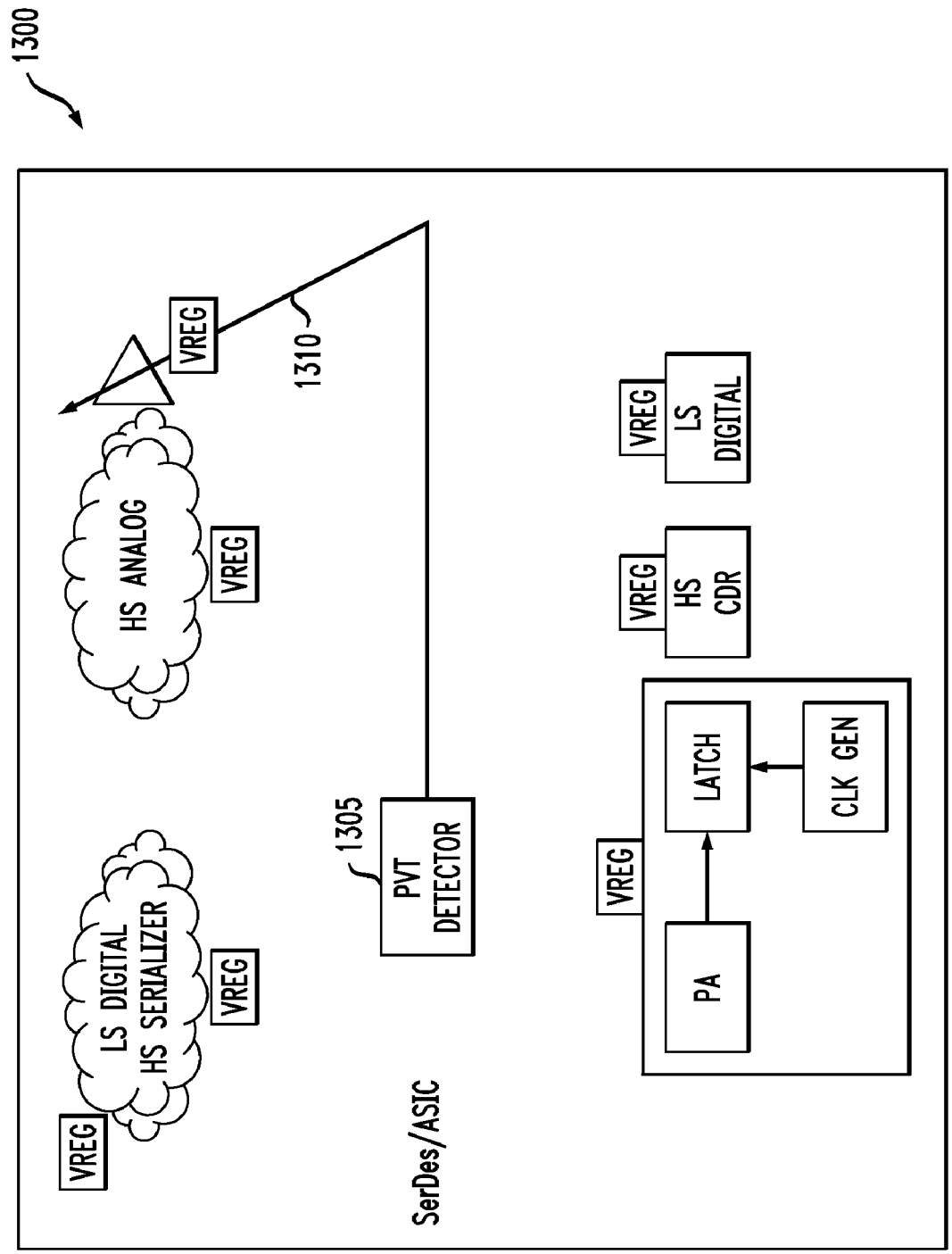
FIG. 13 is a block diagram of a chip having a centralized PVT detector and a feed forward swing control.

FIG. 13 is a block diagram of a chip 1300 having a centralized PVT detector 1305 and a feed forward swing control 1310. The feed-forward swing control 1310 adjusts the swing, or amplitude, of the voltage signal produced by the chip 1300 based on expected changes, such as an expected increase in temperature. If the PVT detector 1305 detects changes in either voltage or temperature, the output of the transmitter is affected. Accordingly, the feed-forward voltage is adjusted to reverse the effect of the PVT change.

Figure 14:
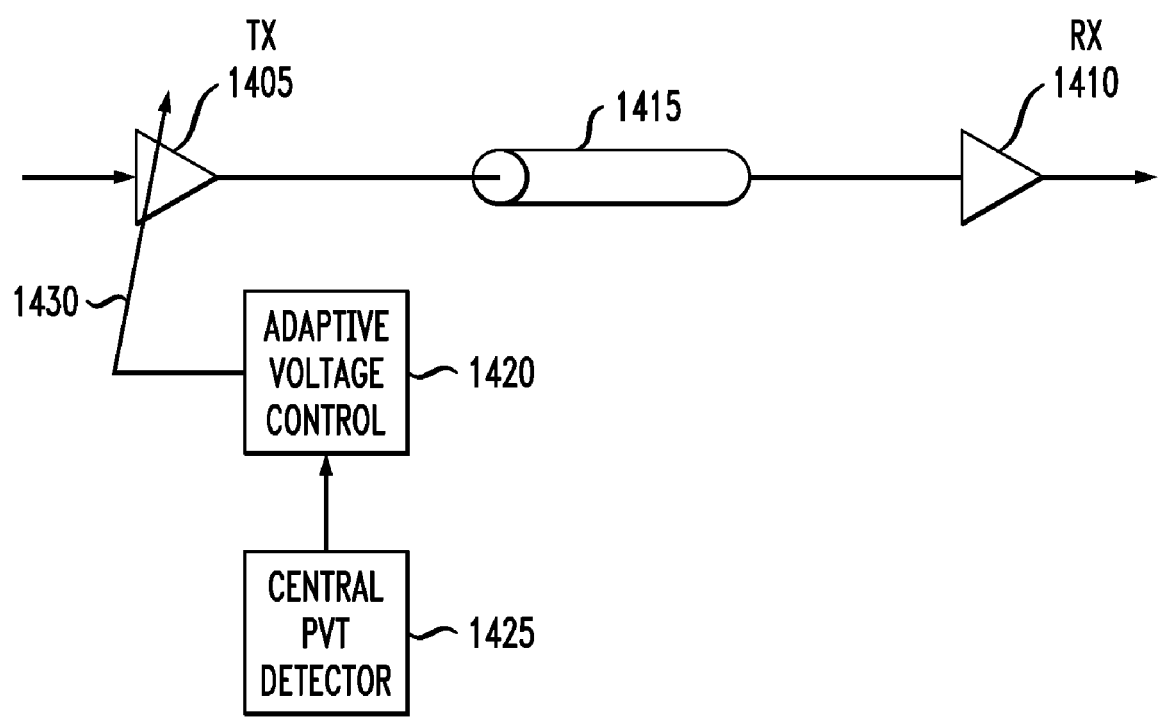
FIG. 14 is a block diagram of a feed forward transmitter in communication with a receiver over a communication channel.

FIG. 14 is a block diagram of a transmitter 1405 in communication with a receiver 1410 over a communication channel 1415. The transmitter is in communication with an adaptive voltage control 1420 and a central PVT detector 1425. This configuration provides a feed-forward swing control (shown by arrow 1430). The feed forward swing control controls the transmitter's voltage swing (i.e., amplitude) by adjusting the supply voltage. This can also control the swing by controlling the drive current as well.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention.

Those skilled in the art could implement various other feature combinations without departing from the scope and spirit of the invention.

The invention claimed is:

1. A circuit comprising:
   a latch operative to sample a voltage of an output of a switching element;
   a processor in communication with said latch and operative to generate a power adjustment signal indicating an adjustment to a supply voltage applied to said switching element, said adjustment based on said sampled voltage, said processor being further operative to generate a threshold voltage adjustment signal indicating an adjustment to a threshold voltage of said latch.

2. The circuit of claim 1 further comprising:
   a counter operative to count a plurality of voltages sampled by said latch.

3. The circuit of claim 2 wherein said counter is further operative to transmit to said processor an output signal based on said plurality of voltages.

4. The circuit of claim 3 wherein said processor determines whether said output signal indicates a digital "1", a digital "0" or a transition point.

5. The circuit of claim 4 wherein said processor is further operative to generate said power adjustment signal when said output signal indicates either a digital "1" or a digital "0".

6. The circuit of claim 1 further comprising a threshold voltage generator in communication with said latch and operative to generate the threshold voltage of said latch responsive to said threshold voltage adjustment signal.

7. The circuit of claim 1 further comprising a power supply control operative to receive said power adjustment signal and adjust a power supply to supply a voltage corresponding to said power adjustment signal to said switching element.

8. The circuit of claim 1 further comprising a power supply operative to receive said power adjustment signal and supply a voltage corresponding to said power adjustment signal to said switching element.

9. The circuit of claim 8 further comprising a regulator control module operative to transmit said supply voltage to a plurality of switching elements.

10. The circuit of claim 1 further comprising a plurality of power supplies, each power supply operative to provide a supply voltage corresponding to said power adjustment signal to a switching element in a plurality of switching elements.

11. The circuit of claim 10 further comprising a plurality of latches, each latch in said plurality operative to sample a voltage of an output signal of a switching element in said plurality of switching elements.

12. The circuit of claim 1 wherein said latch is located in a central location within said circuit.

13. The circuit of claim 1 wherein said latch further comprises a plurality of latches distributed within said circuit.

14. The circuit of claim 1 wherein said processor is located in a central location within said circuit.

15. The circuit of claim 1 wherein said processor further comprises a plurality of processors distributed within said circuit.

16. A method for adjusting a supply voltage applied to a switching element comprising:
    sampling a voltage of an output of said switching element with a latch;
    generating a power adjustment signal indicating an adjustment to said supply voltage applied to said switching element, said adjustment based on said sampled voltage;
    generating a threshold voltage adjustment signal indicating an adjustment to a threshold voltage of said latch.

17. The method of claim 16 further comprising counting a plurality of sampled voltages.

18. The method of claim 17 further comprising transmitting an output signal based on said plurality of sampled voltages to a processor.

19. The method of claim 18 further comprising determining whether said output signal indicates a digital "1", a digital "0" or a transition point.

20. The method of claim 19 further comprising generating said power adjustment signal indicating an adjustment to said supply voltage when said output signal indicates either a digital "1" or a digital "0".

21. A circuit for adjusting a supply voltage applied to a switching element comprising:
    means for sampling a voltage of an output of said switching element;
    means for generating a power adjustment signal indicating an adjustment to said supply voltage applied to said switching element, said adjustment based on said sampled voltage; and
    means for generating a threshold voltage adjustment signal indicating an adjustment to a threshold voltage of said means for sampling.

22. The circuit of claim 21 wherein said means for sampling further comprises means for sampling a plurality of voltages of an output to said switching element.

23. The circuit of claim 22 further comprising means for transmitting, to said means for generating a power adjustment signal, an output signal based on said plurality of sampled voltages.

24. The circuit of claim 23 further comprising means for determining whether said output signal indicates a digital "1", a digital "0" or a transition point.

25. The circuit of claim 24 further comprising means for generating said power adjustment signal indicating an adjustment to said supply voltage when said output signal indicates either a digital "1" or a digital "0".

* * * * *